(12) United States Patent
Wirths et al.

(10) Patent No.: US 12,113,131 B2
(45) Date of Patent: Oct. 8, 2024

(54) STRAIN ENHANCED SIC POWER SEMICONDUCTOR DEVICE AND METHOD OF MANUFACTURING

(71) Applicant: Hitachi Energy Ltd, Zürich (CH)

(72) Inventors: Stephan Wirths, Thalwil (CH); Lars Knoll, Hägglingen (CH)

(73) Assignee: Hitachi Energy Ltd, Zürich (CH)

( * ) Notice: Subject to any disclaimer, the term of this patent is extended or adjusted under 35 U.S.C. 154(b) by 468 days.

(21) Appl. No.: 17/633,804

(22) PCT Filed: Aug. 7, 2020

(86) PCT No.: PCT/EP2020/072295
§ 371 (c)(1),
(2) Date: Feb. 8, 2022

(87) PCT Pub. No.: WO2021/028353
PCT Pub. Date: Feb. 18, 2021

(65) Prior Publication Data
US 2022/0302309 A1    Sep. 22, 2022

(30) Foreign Application Priority Data
Aug. 9, 2019 (EP) .................................. 19191095

(51) Int. Cl.
*H01L 29/78* (2006.01)
*H01L 29/16* (2006.01)
(Continued)

(52) U.S. Cl.
CPC ...... *H01L 29/7843* (2013.01); *H01L 29/1608* (2013.01); *H01L 29/518* (2013.01);
(Continued)

(58) Field of Classification Search
CPC ............. H01L 29/7843; H01L 29/1608; H01L 29/518; H01L 29/66333; H01L 29/66666;
(Continued)

(56) References Cited

U.S. PATENT DOCUMENTS 6,563,152 B2    5/2003 Roberds et al.
7,510,938 B2 *  3/2009 de Fresart ............. H01L 29/165
                                                          438/273
(Continued)

FOREIGN PATENT DOCUMENTS

EP    2477213 A1    7/2012
EP    2933826 A2   10/2015
(Continued)

OTHER PUBLICATIONS

Reboh, Shay, et al., "Mechanics of silicon nitride thin-film stressors on a transistor-like geometry", Applied Physics Letters Materials, vol. 1, Issue 4, id. 042117, Oct. 28, 2013, total 8 pages.
(Continued)

*Primary Examiner* — David Vu
(74) *Attorney, Agent, or Firm* — Slater Matsil, LLP

(57) ABSTRACT

A SiC transistor device includes a SiC semiconductor substrate, a SiC epitaxial layer formed on the top surface of the SiC semiconductor substrate, a source structure formed in the top surface of the SiC epitaxial layer, a source contact structure electrically coupled to the top surface of the source structure, and a gate structure that includes a gate dielectric, a metal gate, and a gate insulation. A first backside metal contact is formed on the bottom surface of the SiC semiconductor substrate, a stress inducing layer is formed on the first backside metal contact, and a second backside metal contact is formed on the stress inducing layer.

20 Claims, 7 Drawing Sheets

(51) Int. Cl.
*H01L 29/51* (2006.01)
*H01L 29/66* (2006.01)
*H01L 29/739* (2006.01)

(52) U.S. Cl.
CPC .. *H01L 29/66333* (2013.01); *H01L 29/66666* (2013.01); *H01L 29/7395* (2013.01); *H01L 29/7802* (2013.01); *H01L 29/7847* (2013.01); *H01L 29/7849* (2013.01)

(58) Field of Classification Search
CPC ............. H01L 29/7395; H01L 29/7802; H01L 29/7847; H01L 29/7849; H01L 29/66068; H01L 29/51; H01L 29/7828
See application file for complete search history.

(56) References Cited

U.S. PATENT DOCUMENTS

| | | | |
|---|---|---|---|
| 7,745,276 B2* | 6/2010 | Okuno | H01L 29/7811 257/E21.409 |
| 2008/0048257 A1 | 2/2008 | de Fresart et al. | |
| 2009/0289284 A1 | 11/2009 | Goh et al. | |
| 2012/0286375 A1 | 11/2012 | Cai et al. | |
| 2015/0091021 A1 | 4/2015 | Yoshie | |
| 2016/0336392 A1 | 11/2016 | Tominaga et al. | |
| 2017/0194438 A1 | 7/2017 | Kumagai et al. | |
| 2018/0363166 A1 | 12/2018 | Wada et al. | |
| 2019/0058048 A1 | 2/2019 | Goto et al. | |

FOREIGN PATENT DOCUMENTS

| | | |
|---|---|---|
| EP | 2933826 A3 | 10/2015 |
| EP | 3024017 A1 | 5/2016 |
| JP | 2008218727 A | 9/2008 |
| JP | 2014519192 A | 8/2014 |
| JP | 2015053308 A | 3/2015 |
| JP | 2015065350 A | 4/2015 |
| JP | 2017152667 A | 8/2017 |

OTHER PUBLICATIONS

Nahar, Manuj, et al., "Stress modulation of titanium nitride thin films deposited using atomic layer deposition", Journal of Vacuum Science & Technology A, vol. 35, Issue 1, Dec. 27, 2016, total 9 pages.

Saxena, Raghvendra S., et al., "A New Strained-Silicon Channel Trench-Gate Power MOSFET: Design and Analysis", IEEE Transactions on Electron Devices, vol. 55, No. 11, Nov. 7, 2008, pp. 3299-3304.

Punetha, Mayank, et al., "A Vertical Super-Junction Strained-Silicon Channel Power MOSFET", TENCON 2015 IEEE Region 10 Conference, Nov. 1-4, 2015, total 4 pages.

* cited by examiner

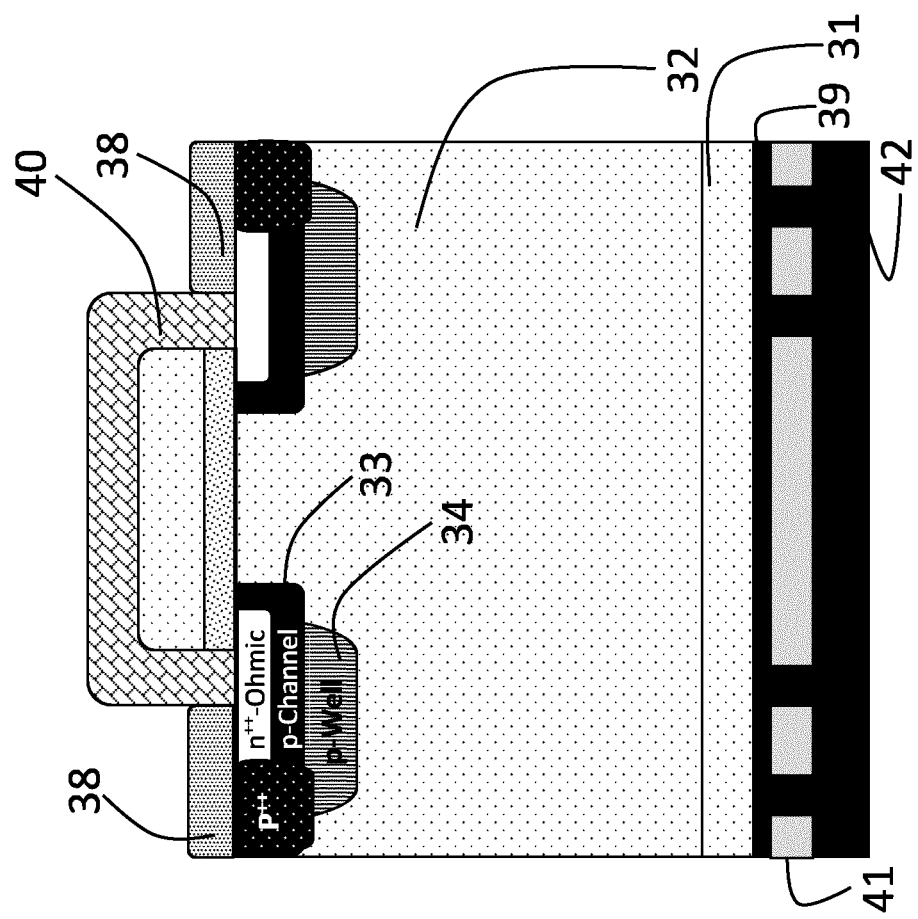
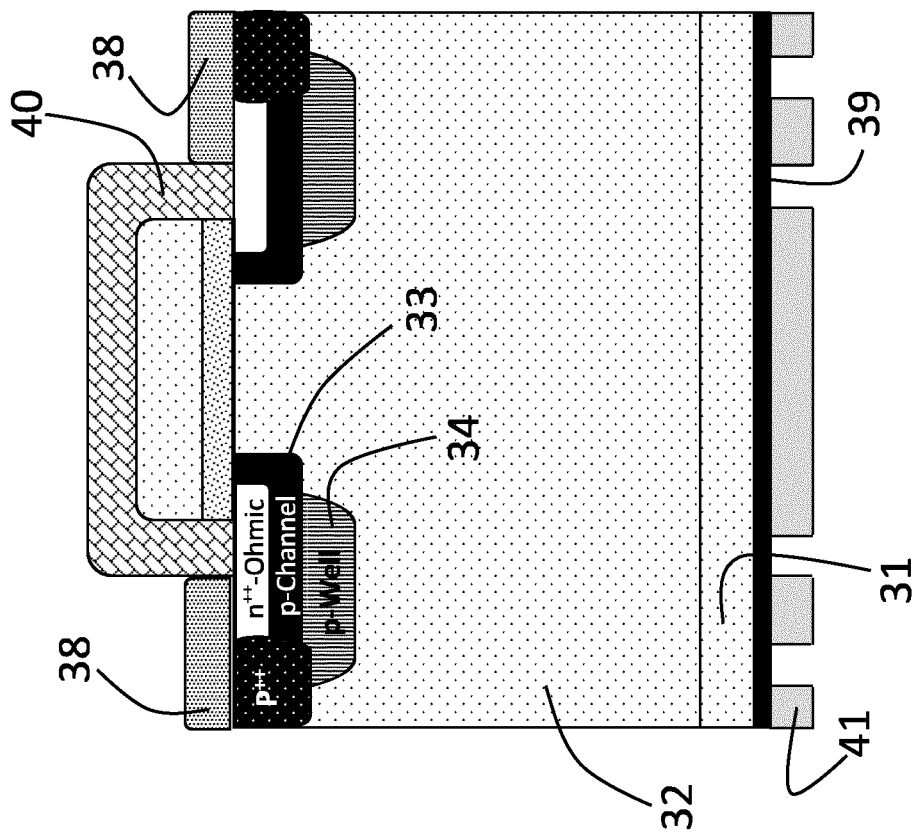
FIG. 3E
FIG. 3F

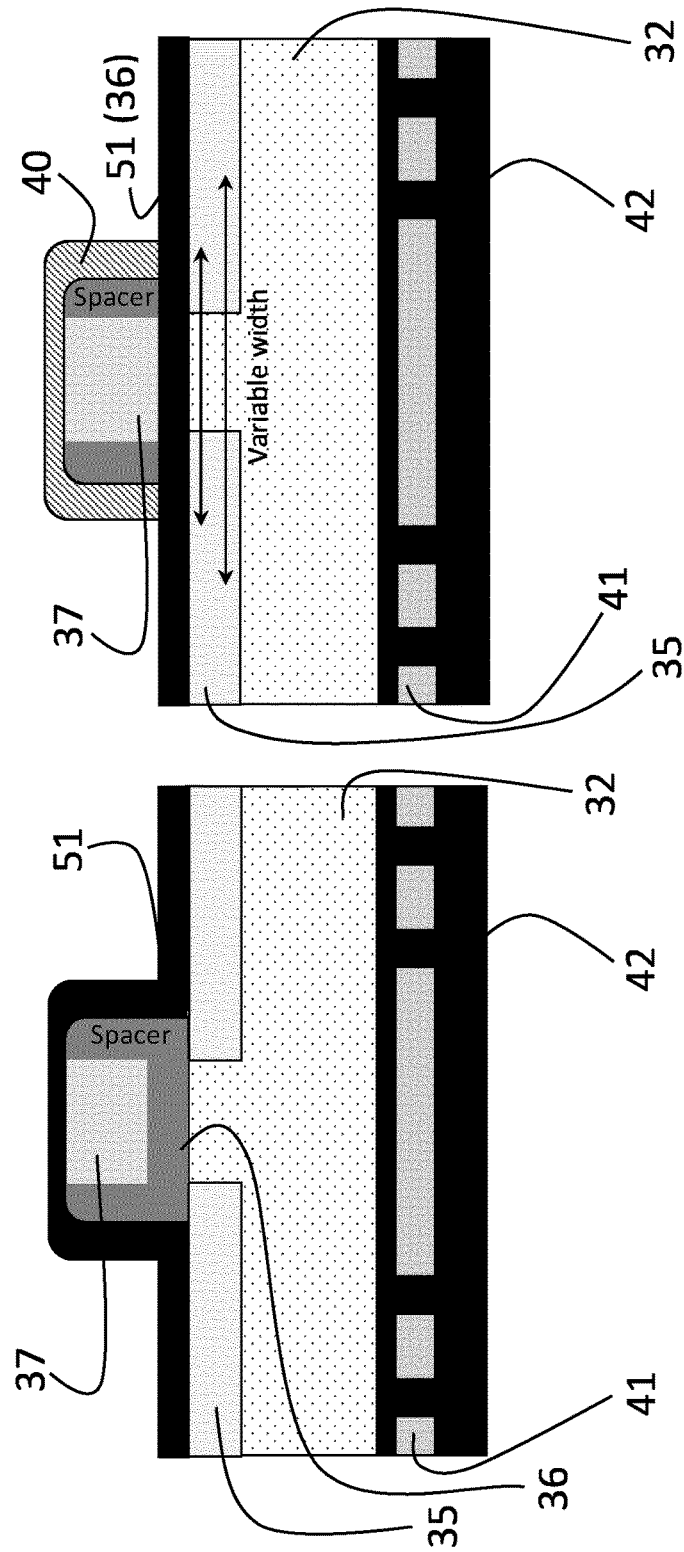

STRAIN ENHANCED SIC POWER SEMICONDUCTOR DEVICE AND METHOD OF MANUFACTURING

CROSS-REFERENCE TO RELATED APPLICATIONS

This is a U.S. national stage application of PCT/EP2020/072295, which was filed on Aug. 7, 2020 and claims the benefit of European patent application 19191095.9, filed Aug. 9, 2019, both of which are incorporated herein by reference.

TECHNICAL FIELD

The present disclosure relates to a strain enhanced SiC (silicon carbide) Power Semiconductor Device and a process flow for manufacturing SiC power semiconductor devices.

BACKGROUND

This section provides background information related to the present disclosure which is not necessarily prior art.

4H-SiC is the preferred polytype for power electronics, such as SiC power devices, e.g., metal-oxide-semiconductor field-effect transistors (MOSFETs) or insulated-gate bipolar transistors (IGBTs), due to the advances in 4H-SiC growth technology as well as its attractive electronic properties such as larger band gap and higher carrier mobility over other available wafer-scale polytypes, e.g. 6H-SiC or 3C-SiC. Although those SiC power devices are already commercially available, there is large room for improvements, especially regarding inversion channel mobility in order to further decrease on-resistance. Whereas, for higher voltage classes >3 kV the drift layer resistance $R_{drift}$ dominates $R_{on}$, the reduction of the latter is essential in commercially more relevant voltage classes (≤1.7 kV)—used, e.g., for electric and hybrid electric vehicles (EVs/HEVs), photovoltaic inverters and power supplies—in order to significantly reduce the on-state power loss and switching losses. Here $R_{on}$ is still considerably higher than ideal as shown, e.g., by the distance of the 900V to 3.3 kV devices from the SiC limit line in FIG. 1. The higher voltage devices as, e.g., 10 kV or 15 kV are far closer to the SiC Limit as the lower voltage devices. In this respect, low inversion channel mobility represents one of the main challenges that might have significant impact on device cost and hence wide spread adoption of SiC power devices. Boosting the inversion channel mobility using improved gate stacks as well as SiC/oxide interfaces showed limited success, but is known as one of the most important milestones in the development and commercialization of SiC power MOSFETs. In the late 90s, the introduction of nitric oxide (NO) post-oxidation for 6H-SiC and its application to 4H-SiC MOSFETs in 2001 enabled an enormous increase in inversion layer electron mobility, because the introduction of N near the interface via NO annealing reduces the interface defect density $D_{it}$. However, there is a strong demand for higher mobility devices beyond state-of-the-art NO annealed power devices particularly in order to expand SiC power devices, in particular SiC MOSFETs into the low/medium voltage classes markets.

Further advantages because of a higher channel mobility are (i) the gate may be driven at lower voltages resulting in smaller oxide fields, which improves threshold stability and oxide long term reliability and (ii) aggressive scaling of the transistor channel length is not required in order to reduce the channel resistance, thus, short channel effects may be avoided.

U.S. Pat. No. 6,563,152 B2 discloses a method for forming a strain layer on an underside of a channel in an MOS transistor in order to produce a mechanical stress in the channel, increasing a mobility of carriers in the channel and an apparatus produced from such a method. Embodiments of the disclosed device include a transistor having a strain layer formed on an underside of a channel in order to produce a mechanical stress in the channel, increasing the mobility of the carriers in the channel. Embodiments of the disclosed device allow for the production of a greater amount of mechanical stress in the channel, and therefore a greater increase in the mobility of the carriers in the channel than other methods of straining the channel such as forming a strain layer on the upper surface of the channel. The strain layer disclosed in U.S. Pat. No. 6,563,152 B2 is embedded within the substrate and needs several removal steps to be built.

US 2009/0289284 A1 discloses a method and a semiconductor device of forming a high shrinkage stressed silicon nitride layer for use as a contact etch stop layer (CESL) or capping layer in a stress management technique (SMT) provides increased tensile stress to a channel of an nFET device to enhance carrier mobility. A spin-on polysilazane-based dielectric material is applied to a semiconductor substrate and baked to form a film layer. The film layer is cured to remove hydrogen from the film which causes shrinkage in the film when it recrystallizes into silicon nitride. The resulting silicon nitride stressed layer introduces an increased level of tensile stress to the transistor channel region.

US 2017/194438 shows a silicon carbide semiconductor device, including a silicon carbide semiconductor structure, an insulated gate structure including a gate insulating film contacting the silicon carbide semiconductor structure and a gate electrode formed on the gate insulating film, an interlayer insulating film covering the insulated gate structure, a metal layer provided on the interlayer insulating film for absorbing or blocking hydrogen, and a main electrode provided on the metal layer and electrically connected to the silicon carbide semiconductor structure.

EP 3 024 017 A1 discloses a technique of securing reliability of a gate insulating film, as much as in a Si power MOSFET, in a semiconductor device in which a semiconductor material having a larger band gap than silicon is used, and which is typified by, for example, an SiC power MOSFET. In order to achieve this object, in the in the SiC power MOSFET, the gate electrode is formed in contact with the gate insulating film, and is formed of the polycrystalline silicon film PF1 having the thickness equal to or smaller than 200 nm, and the polycrystalline silicon film PF2 formed in contact with the polycrystalline silicon film PF1, and having any thickness.

From EP 2 477 213 A1 a method of manufacturing a semiconductor device is known, including the steps of forming a semiconductor layer made of SiC on an SiC substrate, forming a film on the semiconductor layer, and forming a groove in the film. The semiconductor device including a chip having an interlayer insulating film includes a groove formed in the interlayer insulating film to cross the chip.

SUMMARY

This section provides a general summary of the disclosure, and is not a comprehensive disclosure of its full scope or all of its features.

The present disclosure relates to a SiC (silicon carbide) Power Semiconductor Device and a process flow for manufacturing SiC power semiconductor devices. The method of manufacturing exploits inversion channel mobility enhancement due to stress.

In one embodiment, a SiC transistor device comprises a SiC semiconductor substrate having a top surface and a bottom surface. A SiC epitaxial layer is formed on the top surface of the SiC semiconductor substrate. A source structure is formed in the top surface of the SiC epitaxial layer and a source contact structure is electrically coupled to the top surface of the source structure. A gate structure includes a gate oxide, a metal gate, and a gate insulation. A first backside metal contact on the bottom surface of the SiC semiconductor substrate. A stress inducing layer is formed on the first backside metal contact and a second backside metal contact is formed on the stress inducing layer.

Further areas of applicability will become apparent from the description provided herein. The description and specific example in this summary are intended for purposes of illustration only and are not intended to limit the scope of the present disclosure.

BRIEF DESCRIPTION OF THE DRAWINGS

The drawings described herein are for illustrative purposes only of selected embodiments and not all possible implementations, and are not intended to limit the scope of the present disclosure.

FIGS. 3A to 3F show a schematic of the process integration of a backside SiN stressor layer.

FIGS. 5A and 5B show devices with front side and backside SiN stressor layer.

DETAILED DESCRIPTION OF ILLUSTRATIVE EMBODIMENTS

Figure 1:
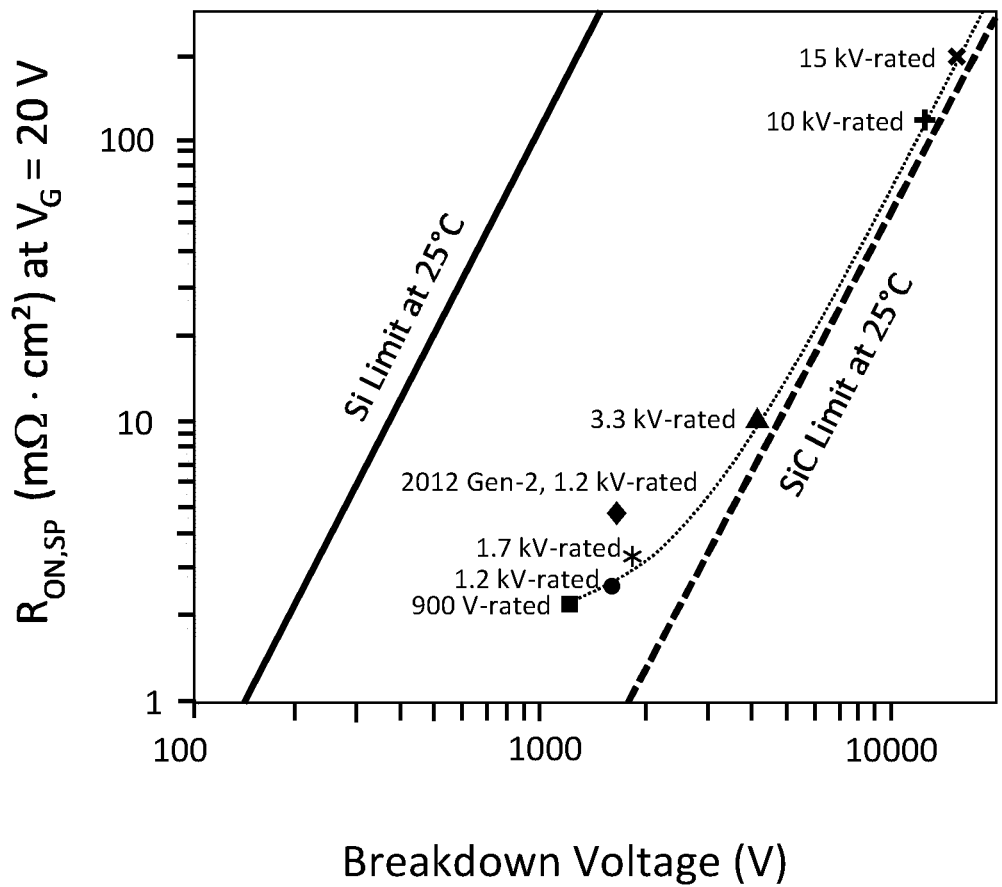
FIG. 1 shows the performance of a state-of-the-art 4H-SiC power MOSFET

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance.

It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" may encompass both an orientation of above and below. The device may be otherwise oriented (rotated 90 degrees or at other orientations) and the spatially relative descriptors used herein interpreted accordingly.

In a first embodiment, the subject disclosure provides for a SiC transistor device comprising a SiC semiconductor substrate having a top surface and a bottom surface, a SiC epitaxial layer formed on the top surface of the SiC semiconductor substrate, the SiC epitaxial layer having a top surface and a bottom surface, a source structure formed in the top surface of the SiC epitaxial layer, the source structure having a top surface and a bottom surface, a source contact structure electrically coupled to the top surface of the source structure a gate structure including a gate oxide, a metal gate and a gate insulation, a first backside metal contact on the bottom surface of the SiC semiconductor substrate, a stress inducing layer on the first backside metal contact, a second backside metal contact on the stress inducing layer.

In accordance with another aspect of the subject disclosure, the second backside metal contact of the SiC transistor device comprises at least one of titanium (Ti), nickel (Ni) or silver (Ag).

In accordance with another aspect of the subject disclosure, the SiC transistor device comprises a second stress inducing layer on the gate structure.

In accordance with another aspect of the subject disclosure, the SiC transistor device comprises a structured and electrically insulating second stress inducing layer on the top surface of the SiC epitaxial layer.

The subject disclosure also provides for a SiC transistor device comprising a SiC semiconductor substrate having a top surface and a bottom surface, a SiC epitaxial layer formed on the top surface of the SiC semiconductor substrate, the SiC epitaxial layer having a top surface and a bottom surface, a source structure formed in the top surface of the SiC epitaxial layer, the source structure having a top surface and a bottom surface, a source contact structure electrically coupled to the top surface of the source structure a gate structure including a gate oxide, a metal gate and a gate insulation, a first contact layer electrically contacting the source contact structure, a second contact layer electrically contacting the metal gate, a first backside metal contact on the bottom surface of the SiC semiconductor substrate, a stress inducing layer on the gate structure wherein the stress inducing layer induces a tensile or compressive stress in a range of 500 MPa to 2000 MPa depending on the manufacturing process.

The subject disclosure also provides for a SiC transistor device comprising a SiC semiconductor substrate having a top surface and a bottom surface, a SiC epitaxial layer formed on the top surface of the SiC semiconductor substrate, the SiC epitaxial layer having a top surface and a bottom surface, a source structure formed in the top surface of the SiC epitaxial layer, the source structure having a top surface and a bottom surface, a structured and electrically insulating stress inducing layer on the top surface of the SiC epitaxial layer, a source contact structure electrically coupled to the top surface of the source structure through the structured stress inducing layer, a gate structure including a metal gate, a first contact layer electrically contacting the source contact structure, a second contact layer electrically contacting the metal gate, a first backside metal contact on the bottom surface of the SiC semiconductor substrate wherein the stress inducing layer induces a tensile or compressive stress in a range of 500 MPa to 2000 MPa depending on the manufacturing process.

In accordance with another aspect of the subject disclosure, a/the first contact layer and/or a/the second contact layer is at least partially covered with a passivation layer.

In accordance with another aspect of the subject disclosure, the substrate and the SiC epitaxial layer is a 4H-SiC of n-type.

In accordance with another aspect of the subject disclosure, the thickness of the stress inducing layer and/or the thickness of the second stress inducing layer is in a range of 1 nm to 1000 nm.

In accordance with another aspect of the subject disclosure, the stress inducing layer and/or the second stress inducing layer comprises SiN.

In accordance with another aspect of the subject disclosure, the stress inducing layer and/or the second stress inducing layer comprises SiN.

In accordance with another aspect of the subject disclosure, the stress inducing layer induces a tensile or compressive stress in a range of 500 MPa to 2000 MPa depending on the manufacturing process.

In accordance with another aspect of the subject disclosure, the SiC transistor device is an insulated-gate bipolar transistor (IGBT).

In accordance with another aspect of the subject disclosure, a method of manufacturing a SiC transistor device is disclosed, comprising the steps of forming a SiC semiconductor substrate having a top surface and a bottom surface, forming epitaxially a SiC epitaxial layer on the top surface of the SiC semiconductor substrate, the SiC epitaxial layer having a top surface and a bottom surface, forming a source structure in the top surface of the SiC epitaxial layer, the source structure having a top surface and a bottom surface, forming a source contact structure electrically coupled to the top surface of the source structure, forming a gate structure on the top surface of the SiC epitaxial layer, wherein the gate structure includes a gate oxide, a metal gate, forming a first backside metal contact on the bottom surface of the SiC semiconductor substrate, forming a stress inducing layer on the first backside metal contact, structuring the stress inducing layer, forming a second backside metal contact on the structured stress inducing layer.

In accordance with another aspect of the subject disclosure a method of manufacturing a SiC transistor device is disclosed, comprising the steps of forming a SiC semiconductor substrate having a top surface and a bottom surface, forming epitaxially a SiC epitaxial layer on the top surface of the SiC semiconductor substrate, the SiC epitaxial layer having a top surface and a bottom surface, forming a source structure in the top surface of the SiC epitaxial layer, the source structure having a top surface and a bottom surface, forming a source contact structure electrically coupled to the top surface of the source structure, forming a gate structure on the top surface of the SiC epitaxial layer, wherein the gate structure includes a metal gate, forming a first contact layer electrically contacting the source contact structure, forming a second contact layer electrically contacting the metal gate, forming a first backside metal contact on the bottom surface of the SiC semiconductor substrate, forming a stress inducing layer at the gate structure, wherein the stress inducing layer induces a tensile or compressive stress in a range of 500 MPa to 2000 MPa depending on the manufacturing process.

In accordance with another aspect of the subject disclosure a method of manufacturing a SiC transistor device is disclosed, comprising the steps of forming a SiC semiconductor substrate having a top surface and a bottom surface, forming epitaxially a SiC epitaxial layer on the top surface of the SiC semiconductor substrate, the SiC epitaxial layer having a top surface and a bottom surface, forming a source structure in the top surface of the SiC epitaxial layer, the source structure having a top surface and a bottom surface, forming an electrically insulating stress inducing layer on the top surface of the SiC epitaxial layer, structuring the electrically insulating stress inducing layer, forming a source contact structure electrically coupled to the top surface of the source structure through the structured electrically insulating stress inducing layer, forming a gate structure on the electrically insulating stress inducing layer, wherein the gate structure includes a metal gate, forming a first contact layer electrically contacting the source contact structure, forming a second contact layer electrically contacting the metal gate, forming a first backside metal contact on the bottom surface of the SiC semiconductor substrate, wherein the stress inducing layer induces a tensile or compressive stress in a range of 500 MPa to 2000 MPa depending on the manufacturing process.

In accordance with another aspect of the subject disclosure, a method of manufacturing a SiC transistor device is disclosed, comprising the steps of forming a SiC semiconductor substrate having a top surface and a bottom surface, forming epitaxially a SiC epitaxial layer on the top surface of the SiC semiconductor substrate, the SiC epitaxial layer having a top surface and a bottom surface, forming a source structure in the top surface of the SiC epitaxial layer, the source structure having a top surface and a bottom surface, forming a source contact structure electrically coupled to the top surface of the source structure, forming a gate structure on the top surface of the SiC epitaxial layer, wherein the gate structure includes a metal gate, forming a first stress inducing layer at the gate structure, forming a first backside metal contact on the bottom surface of the SiC semiconductor substrate, forming a second stress inducing layer on the first backside metal contact, structuring the second stress inducing layer, forming a second backside metal contact on the structured second stress inducing layer.

In accordance with another aspect of the subject disclosure, a method of manufacturing a SiC transistor device is disclosed, comprising the steps of forming a SiC semiconductor substrate having a top surface and a bottom surface, forming epitaxially a SiC epitaxial layer on the top surface of the SiC semiconductor substrate, the SiC epitaxial layer having a top surface and a bottom surface, forming a source structure in the top surface of the SiC epitaxial layer, the source structure having a top surface and a bottom surface, forming an electrically insulating first stress inducing layer on the top surface of the SiC epitaxial layer, structuring the electrically insulating first stress inducing layer, forming a source contact structure electrically coupled to the top surface of the source structure, forming a gate structure on the top surface of the SiC epitaxial layer, wherein the gate structure includes a metal gate, forming a first backside metal contact on the bottom surface of the SiC semiconductor substrate, forming a second stress inducing layer on the first backside metal contact, structuring the second stress inducing layer, forming a second backside metal contact on the structured second stress inducing layer.

Further areas of applicability will become apparent from the description of the figures. Examples of embodiments will now be described more fully with reference to the accompanying drawings.

Figures 2A, 2B, 2C:
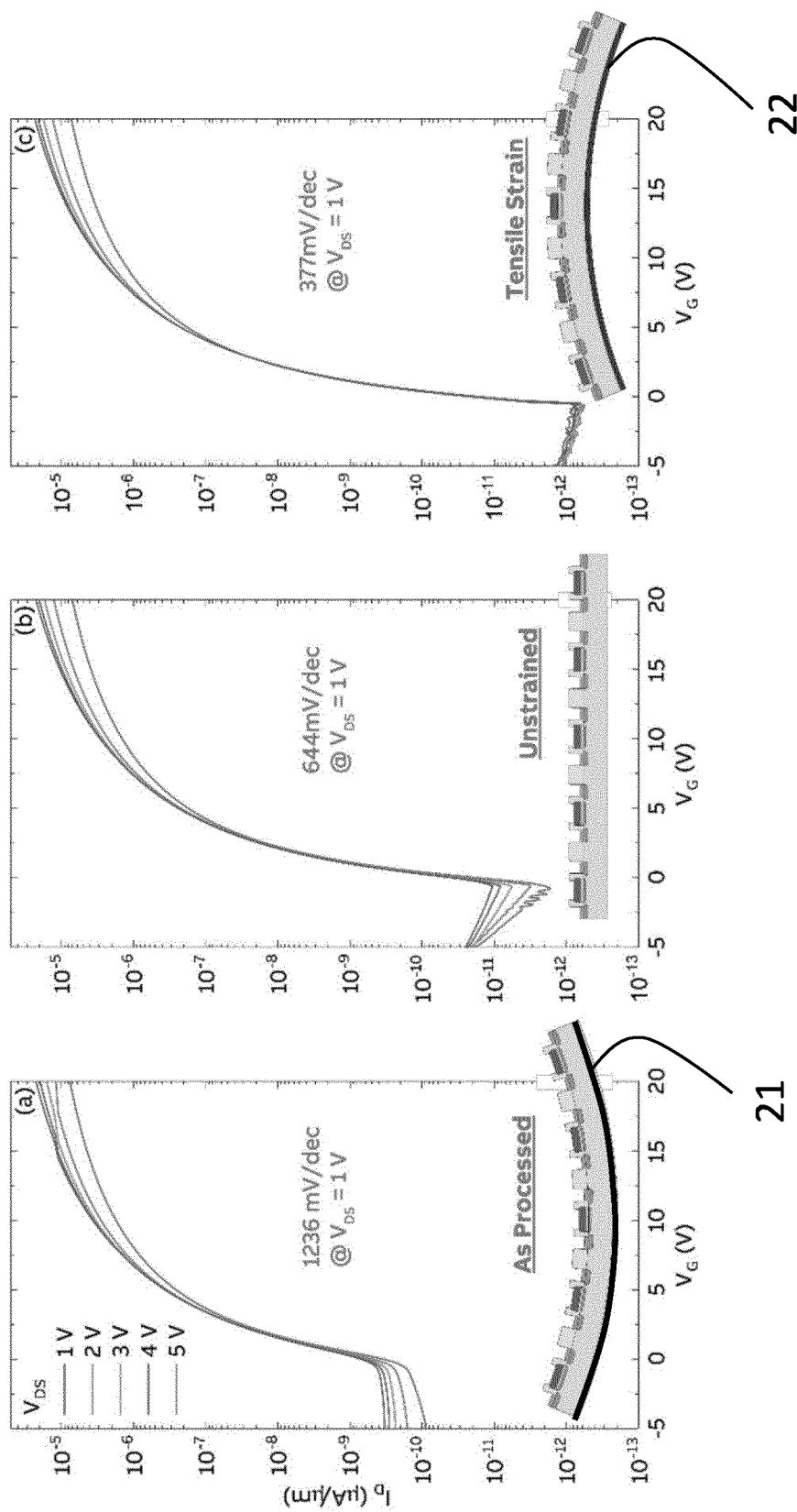
FIG. 2A shows an electrical characterization of an as processed lateral SiC MOSFET
FIG. 2B shows an electrical characterization of an unstrained lateral SiC MOSFET
FIG. 2C shows an electrical characterization of a lateral SiC MOSFET exposed to tensile strain

According to one embodiment of the invention a stressor layer, e.g., a SiN stressor layer, is formed on the backside of a fully processed wafer, to improve the performance of a SiC transistor device. In FIG. 2A to 2C the electrical characterization of differently processed lateral SiC MOSFETs are presented illustrating the advantages of the additional SiN stressor. The transfer characteristics of MOSFETs using a conventional process is shown in FIG. 2A exhibiting $I_{on}/I_{off}$ ratios of approx. $10^5$ and a subthreshold slope of 1236 mV/decade (at $V_{DS}=1V$).

As depicted in the inset scheme, a $SiO_2$ layer 21 on the backside remained after the last processing step which leads to a wafer bow and consequently to a compressively strained surface, i.e., channel, of the MOSFETs. However, by removing this remaining backside layer (relieving the compressive stress), e.g., by etching, the off-currents are significantly reduced by nearly two orders of magnitude and the subthreshold slope decreases to 644 mV/decade (at $V_{DS}=1V$), see FIG. 2B. Finally, for MOSFETs with an additional SiN stressor layer 22 on the backside inducing tensile stress, a further decrease of the subthreshold slope to 377 mV/decade was observed, which is more than three times lower compared to the conventional process shown in FIG. 2A. According to experiments performed by the inventors, the stress depends on the stoichiometry of the material of the stressor layer, in particular on the content of N in the SiN layer.

Figure 3B:
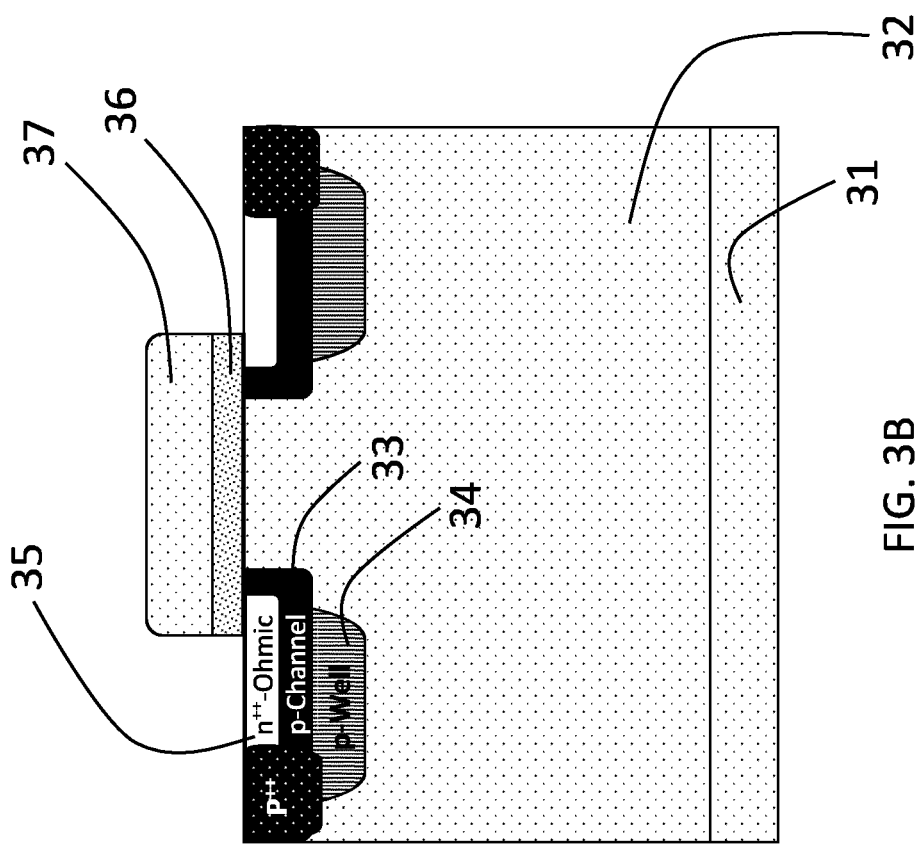
Figure 3A:
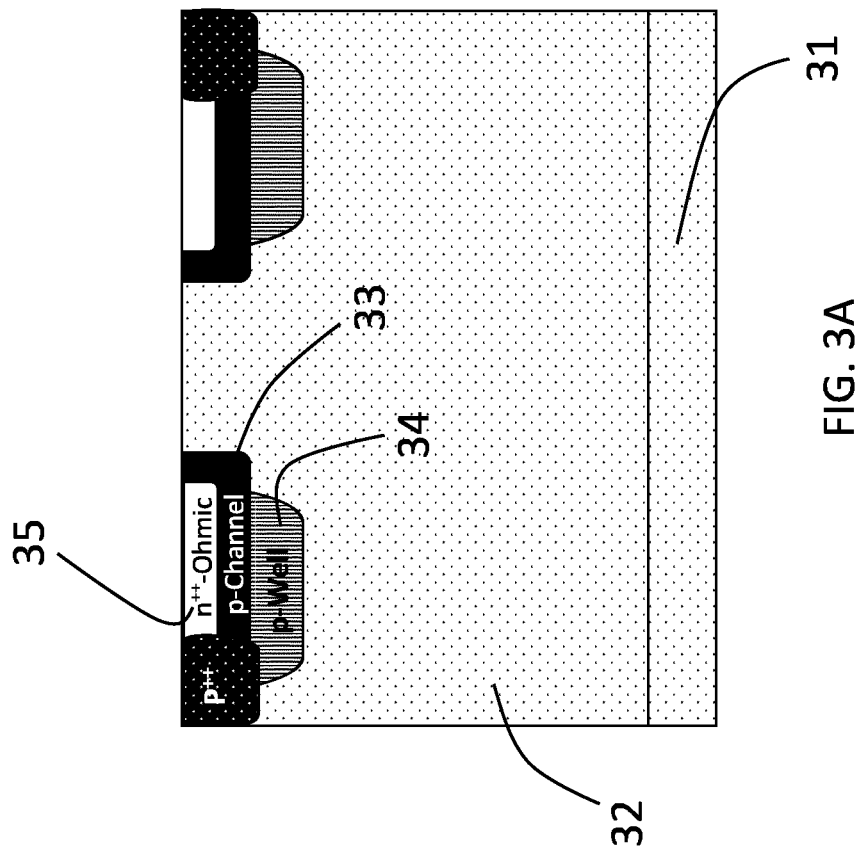
Figure 3D:
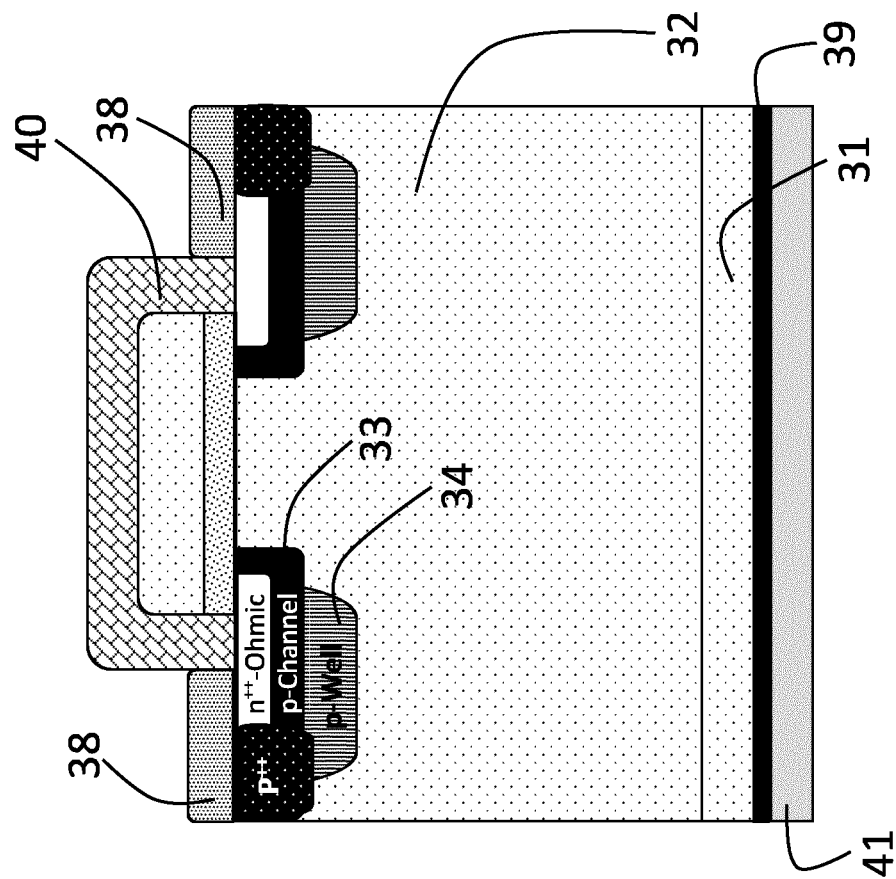
Figure 3C:
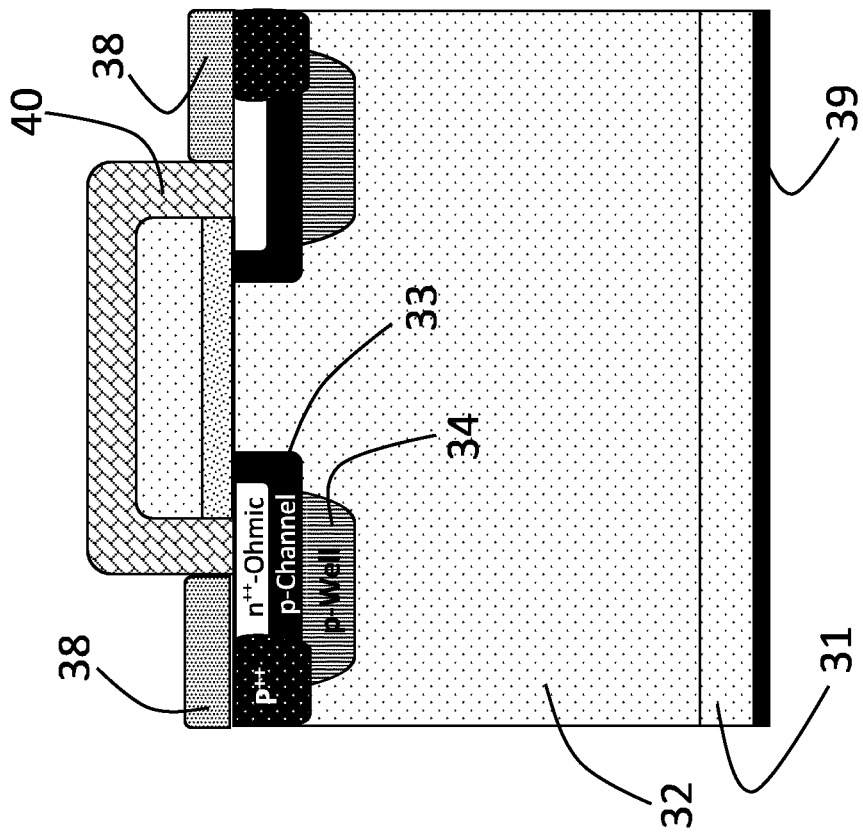

A schematic of an example for a process integration of this backside stressor layer into the existing vertical SiC power MOSFET processing platform is presented in FIGS. 3A to 3F. A similar process however may also be applied for manufacturing a SiC IGBT or a SiC diode. An $n^-$-4H-SiC epilayer 32 is grown on top of an $n^+$-4H-SiC(0001) substrate 31 and acts as drift layer material. The substrate however may also be a Si substrate or a SiC substrate with another crystallographic structure as, e.g., 6H-SiC or 3C-SiC. After the standard implantation steps such as p-channel 33, p-well 34 and $n^{++}$ ohmic contact 35 (source) have been completed (FIG. 3A), the gate stack, comprising at least a gate oxide 36, a metal gate 37 and a gate insulation 40, is processed (FIG. 3B, 3C).

After the subsequent front 38 and backside 39 silicide contact formation, see FIG. 3C, the silicon nitride based stressor layer 41 is formed on the backside of the wafer (FIG. 3D). Examples for methods of manufacturing the silicon nitride based stressor layer 41 on the backside are, e.g., PE-CVD, LP-CVD or ALD. The thickness of the stressor layer 41 (stress inducing layer) is in a range of 1 nm to 1000 nm. The stress induced by the stressor layer 41 is in a range of 500 MPa to 2000 MPa, in a specific embodiment 1000 MPa. Depending on the application of the layer, e.g., on the front side or the backside, the stressor layer is formed to induce tensile stress to the channel of the device. The device fabrication is finalized with a second backside metal contact 42 formation (see FIG. 3E-3F) including a step of structuring the SiN layer (see FIG. 3E) to finally electrically contact the first backside metal contact 39 with the second backside metal contact 42. The backside metal contact 39, 42 may be, e.g., titanium, nickel, aluminum, silver, titanium nitride, tantalum nitride or copper.

Some of the advantages of this backside stressor layer 41 are an improved interface defect density of the 4H-SiC/oxide interface due to the incorporated tensile strain on the channel surface (proven by an increase of the $I_{on}/I_{off}$ ratio and decrease of the subthreshold slope) and an improved interface quality resulting in less carrier scattering. Therefore an enhanced inversion layer electron mobility as well as consequently lower $R_{on}$ of SiC power MOSFETs may be achieved, which is essential to reduce on-state power loss and switching losses especially for commercially highly relevant voltage classes (≤1.7 kV).

Figure 4B:
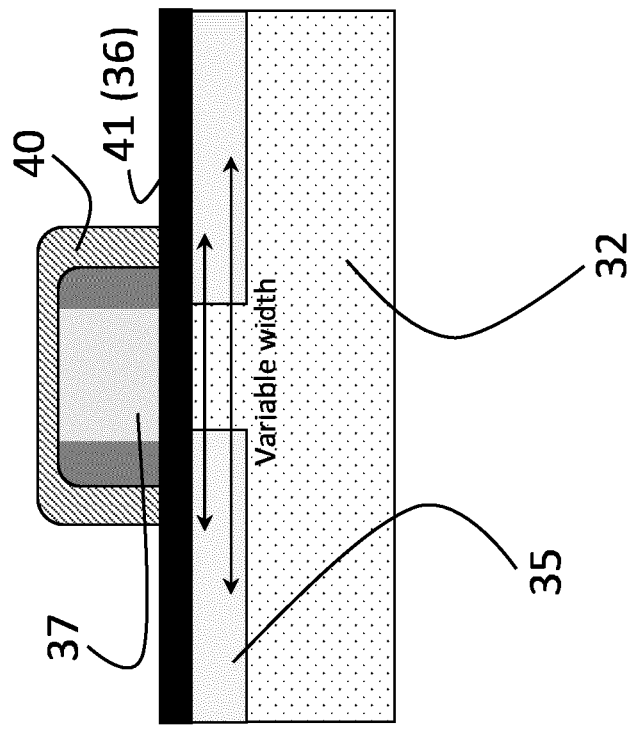
FIGS. 4A and 4B show devices with a front side SiN stressor layer.
Figure 4A:
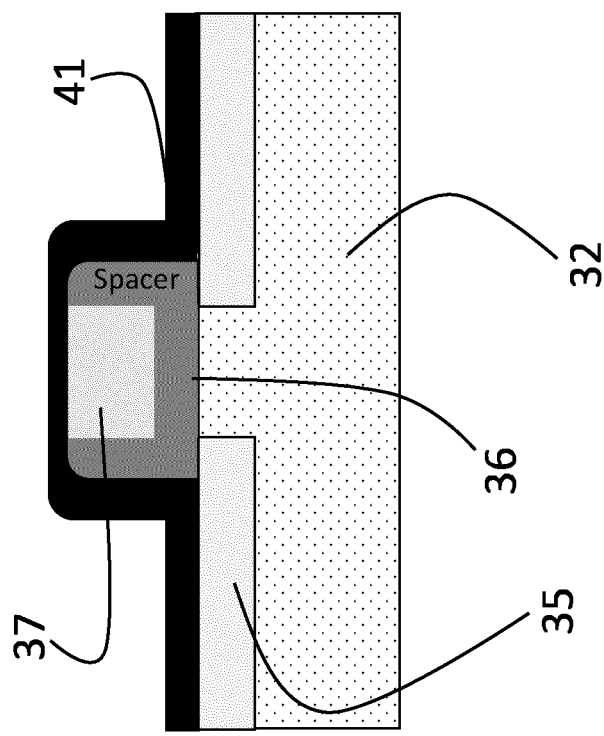

In another embodiment as shown, e.g., in FIG. 4A, the stressor layer is formed on the front side of the device. Contrary to the tensile stress of the SiN-based stressor layer 41 formed on the backside, the SiN-based stressor layer formed on the front side may be formed to induce tensile stress to the channel of the device. Especially for a cell layout, a continuous stressor layer may be formed on the front side.

In another embodiment disclosed in FIG. 4B, the SiN-based stressor layer 41 works as Gate dielectric. In this embodiment, the SiN-based stressor layer 41 would not run over the whole gate structure as shown in FIG. 4A, but is planar formed as electrically insulating stress inducing layer 41 on the top surface of the SiC epitaxial layer 32 and structured after formation as Gate dielectric and to contact the source structure 35. A lateral gate insulation of the gate may be achieved by a spacer structure.

In another embodiment, the stressor layer is not formed as covering the whole front surface, but only formed as stressor lines.

To avoid, e.g., an inhomogeneous stress distribution due to a varying thickness of the stressor layer, in another embodiment, a planarization layer planarizing the surface may be formed before the application of the stressor layer. In another example, this planarization layer is the passivation layer.

In an alternative embodiment, the SiN based stressor layer may also be an electrically conductive stressor like, e.g., titanium nitride. This embodiment has the advantage, that the above mentioned second backside metal contact formation with the preceding structuring step may be omitted.

In other embodiments as disclosed in FIGS. 5A and B, the SiC transistor device comprises a stressor layer on the front side and on the backside of the device. As shown in FIG. 5A, the stressor layer 51 on the front side may run over the gate structure. Alternatively and similar to FIG. 4B, the SiN-based stressor layer 51 on the front side of the embodiment shown in FIG. 5B may be formed on the top surface of the SiC epitaxial layer 32 and may work as gate dielectric. The SiN may provide varying types (tensile or compressive) and varying amounts of stress depending on when and how applied. Therefore, by forming a stressor layer on the top side and on the bottom side of the device the overall level of stress may be adjusted depending on the requirements of the remaining elements and the desired application of the SiC transistor device.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and may be used in a selected embodiment, even if not specifically shown or described. The same may also be varied in many ways. Such variations are not to be regarded as a departure from the disclosure, and all such modifications are intended to be included within the scope of the disclosure.

The invention claimed is:

1. A SiC transistor device comprising:
    a SiC semiconductor substrate having a top surface and a bottom surface;
    a SiC epitaxial layer formed on the top surface of the SiC semiconductor substrate, the SiC epitaxial layer having a top surface;
    a source structure formed in the top surface of the SiC epitaxial layer, the source structure having a top surface;
    a source contact structure electrically coupled to the top surface of the source structure;
    a gate structure including a gate dielectric, a metal gate, and a gate insulation;
    a first backside metal contact on the bottom surface of the SiC semiconductor substrate;
    a stress inducing layer on the first backside metal contact; and
    a second backside metal contact on the stress inducing layer.

2. The SiC transistor device according to claim 1, wherein the second backside metal contact comprises at least one of titanium, nickel, aluminum or silver.

3. The SiC transistor device according to claim 1, further comprising a second stress inducing layer on the gate structure.

4. The SiC transistor device according to claim 1, further comprising a structured and electrically insulating second stress inducing layer on the top surface of the SiC epitaxial layer.

5. The SiC transistor device according to claim 1, further comprising a second stress inducing layer on the gate structure.

6. The SiC transistor device according to claim 1, wherein the stress inducing layer induces a tensile or compressive stress in a range of 500 MPa to 2000 MPa.

7. The SiC transistor device according to claim 1, further comprising a structured and electrically insulating stress inducing layer on the top surface of the SiC epitaxial layer, wherein the source contact structure is electrically coupled to the top surface of the source structure through the structured and electrically insulating stress inducing layer.

8. The SiC transistor device according to claim 7, wherein the structured and electrically insulating stress inducing layer induces a tensile or compressive stress in a range of 500 MPa to 2000 MPa.

9. The SiC transistor device according to claim 1, further comprising a first contact layer electrically contacting the source contact structure and a second contact layer electrically contacting the metal gate, wherein the first contact layer or the second contact layer is at least partially covered with a passivation layer.

10. The SiC transistor device according to claim 1, wherein the SiC semiconductor substrate and the SiC epitaxial layer are both a 4H-SiC of n-type.

11. The SiC transistor device according to claim 1, wherein the stress inducing layer has a thickness between about 1 nm and 1000 nm.

12. The SiC transistor device according to claim 1, wherein the stress inducing layer comprises silicon nitride.

13. The SiC transistor device according to claim 1, wherein the stress inducing layer comprises titanium nitride.

14. The SiC transistor device according to claim 1, wherein the SiC transistor device is a metal-oxide-semiconductor field-effect transistor (MOSFET).

15. The SiC transistor device according to claim 1, wherein the SiC transistor device is an insulated-gate bipolar transistor (IGBT).

16. A method of manufacturing a SiC transistor device comprising:
    forming a SiC semiconductor substrate having a top surface and a bottom surface;
    forming epitaxially a SiC epitaxial layer on the top surface of the SiC semiconductor substrate, the SiC epitaxial layer having a top surface;
    forming a source structure in the top surface of the SiC epitaxial layer, the source structure having a top surface;
    forming a source contact structure electrically coupled to the top surface of the source structure;
    forming a gate structure on the top surface of the SiC epitaxial layer, wherein the gate structure includes a gate dielectric and a metal gate;
    forming a first backside metal contact on the bottom surface of the SiC semiconductor substrate;
    forming a stress inducing layer on the first backside metal contact;
    structuring the stress inducing layer; and
    forming a second backside metal contact on the structured stress inducing layer.

17. The method according to claim 16, further comprising forming a stress inducing layer at the gate structure.

18. The method according to claim 16, further comprising forming an electrically insulating stress inducing layer on the top surface of the SiC epitaxial layer and structuring the electrically insulating stress inducing layer, wherein the source contact structure is electrically coupled to the top surface of the source structure through the structured electrically insulating stress inducing layer and the gate structure is formed on the electrically insulating stress inducing layer.

19. The method according to claim 16, further comprising forming a first contact layer electrically contacting the source contact structure and forming a second contact layer electrically contacting the metal gate.

20. A method of manufacturing a SiC transistor device comprising:

forming a SiC semiconductor substrate having a top surface and a bottom surface;

forming epitaxially a SiC epitaxial layer on the top surface of the SiC semiconductor substrate, the SiC epitaxial layer having a top surface;

forming a source structure in the top surface of the SiC epitaxial layer, the source structure having a top surface;

forming an electrically insulating first stress inducing layer on the top surface of the SiC epitaxial layer;

structuring the electrically insulating first stress inducing layer;

forming a source contact structure electrically coupled to the top surface of the source structure;

forming a gate structure on the top surface of the SiC epitaxial layer, wherein the gate structure includes a metal gate;

forming a first backside metal contact on the bottom surface of the SiC semiconductor substrate;

forming a second stress inducing layer on the first backside metal contact;

structuring the second stress inducing layer; and forming a second backside metal contact on the structured second stress inducing layer.

\* \* \* \* \*